US012078601B2

(12) United States Patent
Reddy et al.

(10) Patent No.: US 12,078,601 B2
(45) Date of Patent: Sep. 3, 2024

(54) UNIVERSAL METROLOGY MODEL

(71) Applicant: KLA Corporation, Milpitas, CA (US)

(72) Inventors: Nireekshan K. Reddy, Tel Aviv (IL);
Vladimir Levinski, Nazareth Ilit (IL);
Amnon Manassen, Haifa (IL)

(73) Assignee: KLA Corporation, Milpitas, CA (US)

( * ) Notice: Subject to any disclaimer, the term of this patent is extended or adjusted under 35 U.S.C. 154(b) by 0 days.

(21) Appl. No.: 17/955,385

(22) Filed: Sep. 28, 2022

(65) Prior Publication Data

US 2023/0384237 A1     Nov. 30, 2023

Related U.S. Application Data

(60) Provisional application No. 63/347,133, filed on May 31, 2022.

(51) Int. Cl.
*G01N 21/95*     (2006.01)
*G01N 21/01*     (2006.01)
(Continued)

(52) U.S. Cl.
CPC ......... *G01N 21/9501* (2013.01); *G03F 7/705* (2013.01); *G01N 21/01* (2013.01);
(Continued)

(58) Field of Classification Search
CPC ............... G01N 21/9501; G01N 21/01; G01N 21/956; G01N 2021/5957; G03F 7/705;
(Continued)

(56) References Cited

U.S. PATENT DOCUMENTS 9,116,834 B2 *    8/2015   Van Beurden .......... G03F 7/705
10,222,709 B2 *    3/2019   Quintanilha ........ G03F 7/70591
(Continued)

FOREIGN PATENT DOCUMENTS

EP     3087594 B1     4/2020

OTHER PUBLICATIONS

Korean Intellectual Property Office, International Search Report and Written Opinion for International Application No. PCT/US2023/022796, Sep. 4, 2023, 8 pages.
(Continued)

*Primary Examiner* — Mohamed Charioui
*Assistant Examiner* — Lynda Dinh
(74) *Attorney, Agent, or Firm* — Suiter Swantz IP

(57) ABSTRACT

A metrology system may arrange metrology measurements for a plurality of metrology targets distributed in a plurality of fields on one or samples into a signal vector, where the metrology measurements associated with the metrology targets in each of the plurality of fields are grouped within the signal vector. The system may further decompose the signal vector into reconstruction vectors associated with different spectral components of the signal vector. The system may further classify a subset of the reconstruction vectors as components of a metrology model, where a sum of the components corresponds to a metrology model describing the metrology measurements on the one or more samples. The system may further generate control signals to control one or more processing tools based on the metrology model.

38 Claims, 9 Drawing Sheets

(51) Int. Cl.
  *G03F 7/00* (2006.01)
  *G01N 21/59* (2006.01)
  *G01N 21/956* (2006.01)
(52) U.S. Cl.
  CPC ............... *G01N 2021/5957* (2013.01); *G01N 21/956* (2013.01); *G03F 7/70625* (2013.01); *G03F 7/70633* (2013.01)
(58) Field of Classification Search
  CPC ............. G03F 7/70633; G03F 7/70625; G03F 7/706837; G03F 7/706839
  See application file for complete search history.

(56) References Cited

U.S. PATENT DOCUMENTS

| | | | |
|---|---|---|---|
| 10,359,706 B1* | 7/2019 | Sriraman | G03F 7/70141 |
| 10,935,893 B2 | 3/2021 | Pandev et al. | |
| 2010/0209830 A1 | 8/2010 | Carcasi et al. | |
| 2011/0255066 A1* | 10/2011 | Fuchs | G03F 7/70633 355/77 |
| 2012/0268744 A1* | 10/2012 | Wolf | G01N 21/95607 356/447 |
| 2014/0136137 A1* | 5/2014 | Tarshish-Shapir | G01N 21/4788 702/108 |
| 2014/0172394 A1 | 6/2014 | Kuznetsov et al. | |
| 2019/0004438 A1* | 1/2019 | Amit | H01L 22/12 |
| 2019/0049602 A1 | 2/2019 | Hench et al. | |
| 2019/0064680 A1* | 2/2019 | Schmitt-Weaver | G03F 7/705 |
| 2022/0392809 A1 | 12/2022 | Manassen et al. | |

OTHER PUBLICATIONS

U.S. Appl. No. 17/705,077, filed Mar. 25, 2022, KLA Corporation.

* cited by examiner

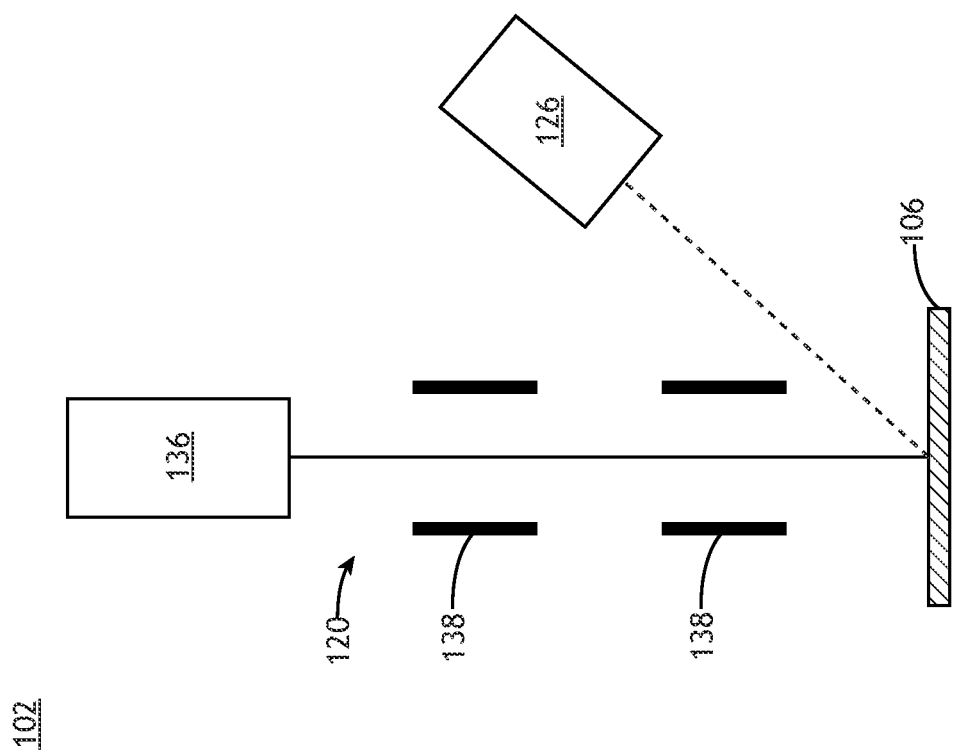

UNIVERSAL METROLOGY MODEL

CROSS-REFERENCE TO RELATED APPLICATION

The present application claims the benefit under 35 U.S.C. § 119(e) of U.S. Provisional Application Ser. No. 63/347,133, filed May 31, 2022, entitled MODELLING OVERLAY ON WAFER WITHOUT POLYNOMIALS: A UNIVERSAL MODEL, which is incorporated herein by reference in the entirety.

TECHNICAL FIELD

The present disclosure relates generally to metrology measurements and, more particularly, to modeling metrology measurements across multiple metrology targets.

BACKGROUND

Metrology measurements are commonly used in semiconductor processing for monitoring and/or control of various fabrication processes. For example, a fabricated sample may include multiple instances of an exposure field and measurements may be taken at various metrology targets within the fields. It may then be desirable to generate a model of the metrology measurements to account for variations both within and between fields. However, existing modeling techniques have various drawbacks such as, but not limited to, inaccuracies or inadequate robustness. There is therefore a need to develop systems and methods to cure the above deficiencies.

SUMMARY

A metrology system is disclosed in accordance with one or more illustrative embodiments of the present disclosure. In one illustrative embodiment, the system includes a controller. In another illustrative embodiment, the controller arranges metrology measurements for metrology targets distributed in various fields on one or samples into a signal vector, where the metrology measurements associated with the metrology targets in each of the fields are grouped within the signal vector. In another illustrative embodiment, the controller decomposes the signal vector into reconstruction vectors associated with different spectral components of the signal vector. In another illustrative embodiment, the controller classifies a subset of the reconstruction vectors as components of a metrology model, where a sum of the components corresponds to a metrology model describing the metrology measurements on the one or more samples. In another illustrative embodiment, the controller generates control signals to control one or more processing tools based on the metrology model.

A metrology system is disclosed in accordance with one or more illustrative embodiments of the present disclosure. In one illustrative embodiment, the system includes a metrology sub-system to generate metrology measurements for metrology targets distributed in various fields on one or more samples in accordance with a metrology recipe. In another illustrative embodiment, the system includes a controller. In another illustrative embodiment, the controller arranges the metrology measurements into a signal vector, where the metrology measurements associated with the metrology targets in each of the fields are grouped within the signal vector. In another illustrative embodiment, the controller decomposes the signal vector into reconstruction vectors associated with different spectral components of the signal vector. In another illustrative embodiment, the controller classifies a subset of the reconstruction vectors as components of a metrology model, where a sum of the components corresponds to a metrology model describing the metrology measurements on the one or more samples. In another illustrative embodiment, the controller generates control signals to control one or more processing tools based on the metrology model.

A metrology method is disclosed in accordance with one or more illustrative embodiments of the present disclosure. In one illustrative embodiment, the method includes generating metrology measurements for metrology targets distributed in various fields on one or more samples. In another illustrative embodiment, the method includes arranging the metrology measurements into a signal vector, wherein the metrology measurements associated with the metrology targets in each of the fields are grouped within the signal vector. In another illustrative embodiment, the method includes decomposing the signal vector into reconstruction vectors associated with different spectral components of the signal vector. In another illustrative embodiment, the method includes classifying a subset of the reconstruction vectors as components of a metrology model, where a sum of the components corresponds to a metrology model describing the metrology measurements on the one or more samples. In another illustrative embodiment, the method includes generating control signals to control one or more processing tools based on the metrology model.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF DRAWINGS

The numerous advantages of the disclosure may be better understood by those skilled in the art by reference to the accompanying figures.

FIG. 1C is a conceptual diagram of a particle-beam metrology sub-system, in accordance with one or more embodiments of the present disclosure.

DETAILED DESCRIPTION

Figure 1A:
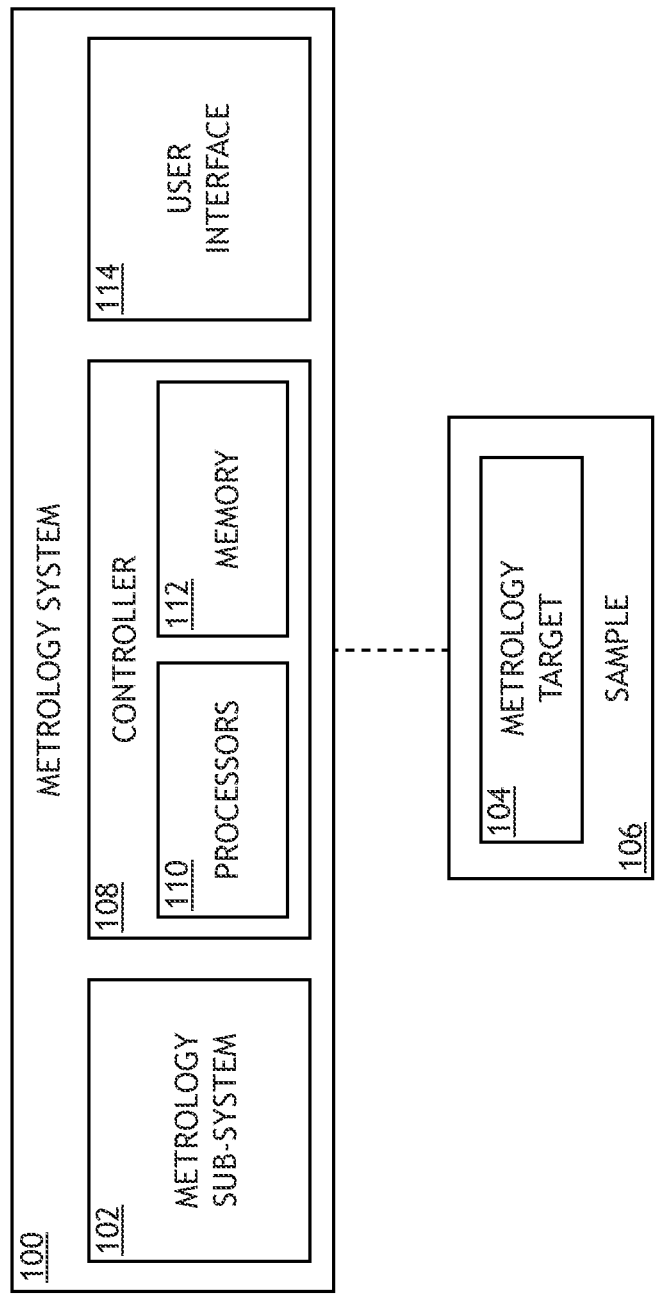
FIG. 1A is a block diagram of a metrology system, in accordance with one or more embodiments of the present disclosure.

Reference will now be made in detail to the subject matter disclosed, which is illustrated in the accompanying drawings. The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

Embodiments of the present disclosure are directed to systems and methods for modeling metrology measurements taken across metrology targets within fields of one or more samples based on spectral decomposition of the metrology measurements. It is contemplated herein that such a technique may provide a universal modeling technique for generating models of the metrology measurements that may provide robust and accurate characterization of variations of the metrology measurements across multiple length scales.

Metrology measurements are widely used for monitoring and/or control of fabrication processes. As an illustration in the context of semiconductor fabrication, devices may be fabricated through the successive formation of patterned layers. For example, a patterned layer may be formed through a series of steps such as, but not limited to, deposition of a sample layer and a photoresist, lithographic exposure of the photoresist with a desired pattern, etching of the photoresist and the sample layer to generate the desired pattern in the sample layer, and removal of the photoresist. Typically, many devices are fabricated on a single sample in parallel, where portions of the sample associated with different instances of the devices (or portions thereof) are referred to as dies, which may be separated by scribe lines to facilitate subsequent singulation. Further, lithography tools (e.g., scanners, steppers, or the like) typically have an exposure field of view (e.g., field size) substantially smaller than the sample itself and thus typically expose multiple fields across the sample, where each field may include patterns associated with multiple dies.

It is typically desirable to monitor and/or control the lithographic exposure steps based metrology measurements at various metrology targets across the sample. Such metrology targets may include dedicated metrology targets (e.g., overlay targets, or the like) and/or device features. One or more metrology models may then characterize variations of the metrology measurements across a single sample or multiple samples. For example, metrology measurements within a field typically follow a consistent pattern such that this pattern is periodic when considering multiple fields. Such patterns may be captured by a field model or field contributions to a full model. As another example, metrology measurements across a sample may exhibit relatively slow variations (e.g., on length scales equal to or greater than a field size), which may be captured by a wafer model or wafer contributions to a full model. As another example, metrology measurements. Further variations may be considered noise and may be associated with residuals of field and/or wafer contributions of a model.

It may generally be desirable to generate field and/or wafer models that are robust and accurately distinguish the field and/or wafer components from noise. Put another way, it is generally desirable that that residuals of a metrology model actually correspond to noise in the measurements rather than containing field and/or wafer components.

In embodiments, the metrology measurements of interest are hierarchically arranged into a signal vector. For example, metrology measurements associated with metrology targets in each of the fields may be grouped within the signal vector based on spatial proximity. Further, the metrology measurements associated with different fields may be arranged within the signal vector based on spatial proximity. In embodiments, this signal vector is decomposed (e.g., using a singular value decomposition (SVD) technique, or the like) into reconstruction vectors associated with different spectral components (e.g., different length scales) of the signal vector. In this way, the signal vector may be equal to a sum of the reconstruction vectors. In embodiments, the reconstruction vectors are then classified into various groups such as, but not limited to, field components, wafer components, and residual components. For example, a sum of reconstruction vectors classified as field components may correspond to a field model describing variations of the metrology measurements between the metrology targets within each of the fields. Similarly, a sum of reconstruction vectors classified as wafer components may correspond to a wafer model describing variations of the metrology measurements between the fields (e.g., relatively low-frequency variations)

It is contemplated that such a technique may provide a robust and universal metrology model that is suitable for a wide range of applications and processes. In particular, the generation of reconstruction vectors using spectral decomposition techniques may efficiently identify dominant length scales (e.g., spectral components) in the signal vector, which may correspond to field components, wafer components and/or residuals. Put another way, the techniques disclosed herein provide universality based on analysis of the metrology measurements in a given set without the need for regression to an external basis such as polynomials. In particular, regression-based techniques (e.g., polynomial-based regression techniques) may typically require a substantial number of fitting parameters to provide an adequate fit and may thus suffer from relatively low robustness to variations. Further, different polynomial basis may be required for accurate modeling of different applications or processes. In contrast, spectral decomposition technique disclosed herein may both identify a relevant basis (e.g., the reconstruction vectors) based on the data itself and require relatively fewer basis elements for accurate characterization of field and/or wafer components. In this way, the techniques disclosed herein may be both universal and robust.

Further, such a technique may provide advantages over techniques based on principal component analysis. For example, an adaptive model based on principal component analysis is generally described in U.S. patent application Ser. No. 17/705,077 titled ADAPTIVE MODELING MISREGISTRATION MEASUREMENT SYSTEM AND METHOD filed on Mar. 25, 2022, which is incorporated herein by reference in its entirety. Such techniques may make unnecessary assumptions about a lack of correlation between various modeling terms (e.g., wafer and field terms). However, the systems and methods disclosed herein provides reconstruction vectors associated with different length scales that may be classified into different models or components thereof (e.g., field and wafer models) without any such assumptions.

Additional embodiments of the present disclosure are directed to controlling one or more processing tools (e.g., lithography tools) based on the field and/or wafer components generated through spectral decomposition as disclosed herein.

Referring now to FIGS. 1A-7, systems and methods for metrology modeling are described in greater detail, in accordance with one or more embodiments of the present disclosure.

FIG. 1A is a block diagram of a metrology system 100, in accordance with one or more embodiments of the present disclosure.

In embodiments, the metrology system 100 includes a metrology sub-system 102 suitable for generating metrology measurements of metrology targets 104 distributed across one or more samples 106.

The sample 106 may include any object that is the source of a metrology measurement. For example, the sample 106 may include a substrate formed of a semiconductor or non-semiconductor material (e.g., a wafer, or the like). A semiconductor or non-semiconductor material may include, but is not limited to, monocrystalline silicon, gallium arsenide, and indium phosphide. The sample 106 may include one or more layers. For example, such layers may include, but are not limited to, a resist, a dielectric material, a conductive material, and a semiconductive material. Many different types of such layers are known in the art, and the term sample as used herein is intended to encompass a sample on which all types of such layers may be formed. One or more layers formed on a sample 106 may be patterned or unpatterned. For example, a sample 106 may include a plurality of dies, each having repeatable patterned features. Formation and processing of such layers of material may ultimately result in completed devices. Many different types of devices may be formed on a sample 106, and the term sample 106 as used herein is intended to encompass a sample 106 on which any type of device known in the art is being fabricated. Further, for the purposes of the present disclosure, the term sample 106 and wafer should be interpreted as interchangeable.

The metrology measurements of a sample 106 generated by the metrology sub-system 102 may provide any type of data and may be generated using any technique known in the art. In some embodiments, the metrology measurements generated by the metrology sub-system 102 are overlay measurements characterizing registration (or registration errors) between different lithographic exposures on one or more layers of a sample 106. In some embodiments, the metrology measurements generated by the metrology sub-system 102 characterize conditions of a lithographic exposure such as, but not limited to, a focal position of a sample 106 or an illumination dose. In some embodiments, the metrology measurements generated by the metrology sub-system 102 characterize additional aspects of a fabrication process such as, but not limited to, an etching step or a polishing step.

A metrology target 104 may include any location on the sample 106 suitable for a metrology measurement with a metrology sub-system 102. In some embodiments, a metrology target 104 includes features associated with a device being fabricated, which are referred to herein as device features. In some embodiments, a metrology target 104 includes dedicated features designed to facilitate metrology measurements. As an illustration in the context of overlay metrology, a dedicated overlay metrology target 104 may include features associated with each of the lithographic exposures of interest in overlapping or non-overlapping positions on the sample 106 in an arrangement that enables robust and accurate overlay measurements by the metrology sub-system 102.

In embodiments, the metrology system 100 includes a controller 108 communicatively coupled to any components therein. The controller 108 may include one or more processors 110. For example, the one or more processors 110 may be configured to execute a set of program instructions maintained in a memory device 112, or memory. The one or more processors 110 of a controller 108 may include any processing element known in the art. In this sense, the one or more processors 110 may include any microprocessor-type device configured to execute algorithms and/or instructions.

The one or more processors 110 of a controller 108 may include any processor or processing element known in the art. For the purposes of the present disclosure, the term "processor" or "processing element" may be broadly defined to encompass any device having one or more processing or logic elements (e.g., one or more microprocessor devices, one or more application specific integrated circuit (ASIC) devices, one or more field programmable gate arrays (FPGAs), or one or more digital signal processors (DSPs)). In this sense, the one or more processors 110 may include any device configured to execute algorithms and/or instructions (e.g., program instructions stored in memory). In some embodiments, the one or more processors 110 may be embodied as a desktop computer, mainframe computer system, workstation, image computer, parallel processor, networked computer, or any other computer system configured to execute a program configured to operate or operate in conjunction with the metrology system 100, as described throughout the present disclosure. Moreover, different subsystems of the metrology system 100 may include a processor or logic elements suitable for carrying out at least a portion of the steps described in the present disclosure. Therefore, the above description should not be interpreted as a limitation on the embodiments of the present disclosure but merely as an illustration. Further, the steps described throughout the present disclosure may be carried out by a single controller or, alternatively, multiple controllers. Additionally, the controller 108 may include one or more controllers housed in a common housing or within multiple housings. In this way, any controller or combination of controllers may be separately packaged as a module suitable for integration into the metrology system 100.

The memory device 112 may include any storage medium known in the art suitable for storing program instructions executable by the associated one or more processors 110. For example, the memory device 112 may include a non-transitory memory medium. By way of another example, the memory device 112 may include, but is not limited to, a read-only memory (ROM), a random-access memory (RAM), a magnetic or optical memory device (e.g., disk), a magnetic tape, a solid-state drive and the like. It is further noted that the memory device 112 may be housed in a common controller housing with the one or more processors 110. In some embodiments, the memory device 112 may be located remotely with respect to the physical location of the one or more processors 110 and the controller 108. For instance, the one or more processors 110 of the controller 108 may access a remote memory (e.g., server), accessible through a network (e.g., internet, intranet and the like).

The controller 108 may direct (e.g., through control signals) and/or receive data from any components or sub-systems of the metrology system 100 such as, but not limited to, the metrology sub-system 102 as well as other system such as one or more process tools for fabricating samples 106 (e.g., a lithography tool, or the like). The controller 108 may further be configured to perform any of the various process steps described throughout the present disclosure.

In one embodiment, the metrology system 100 includes a user interface 114 communicatively coupled to the controller 108. In one embodiment, the user interface 114 may include, but is not limited to, one or more desktops, laptops, tablets, and the like. In another embodiment, the user interface 114 includes a display used to display data of the metrology system 100 to a user. The display of the user interface 114 may include any display known in the art. For example, the display may include, but is not limited to, a liquid crystal display (LCD), an organic light-emitting diode (OLED) based display, or a CRT display. Those skilled in the art should recognize that any display device capable of integration with a user interface 114 is suitable for implementation in the present disclosure. In another embodiment, a user may input selections and/or instructions responsive to data displayed to the user via a user input device of the user interface 114.

Referring now to FIGS. 2-7, techniques for modeling metrology measurements are described in greater detail, in accordance with one or more embodiments of the present disclosure.

Figure 2:
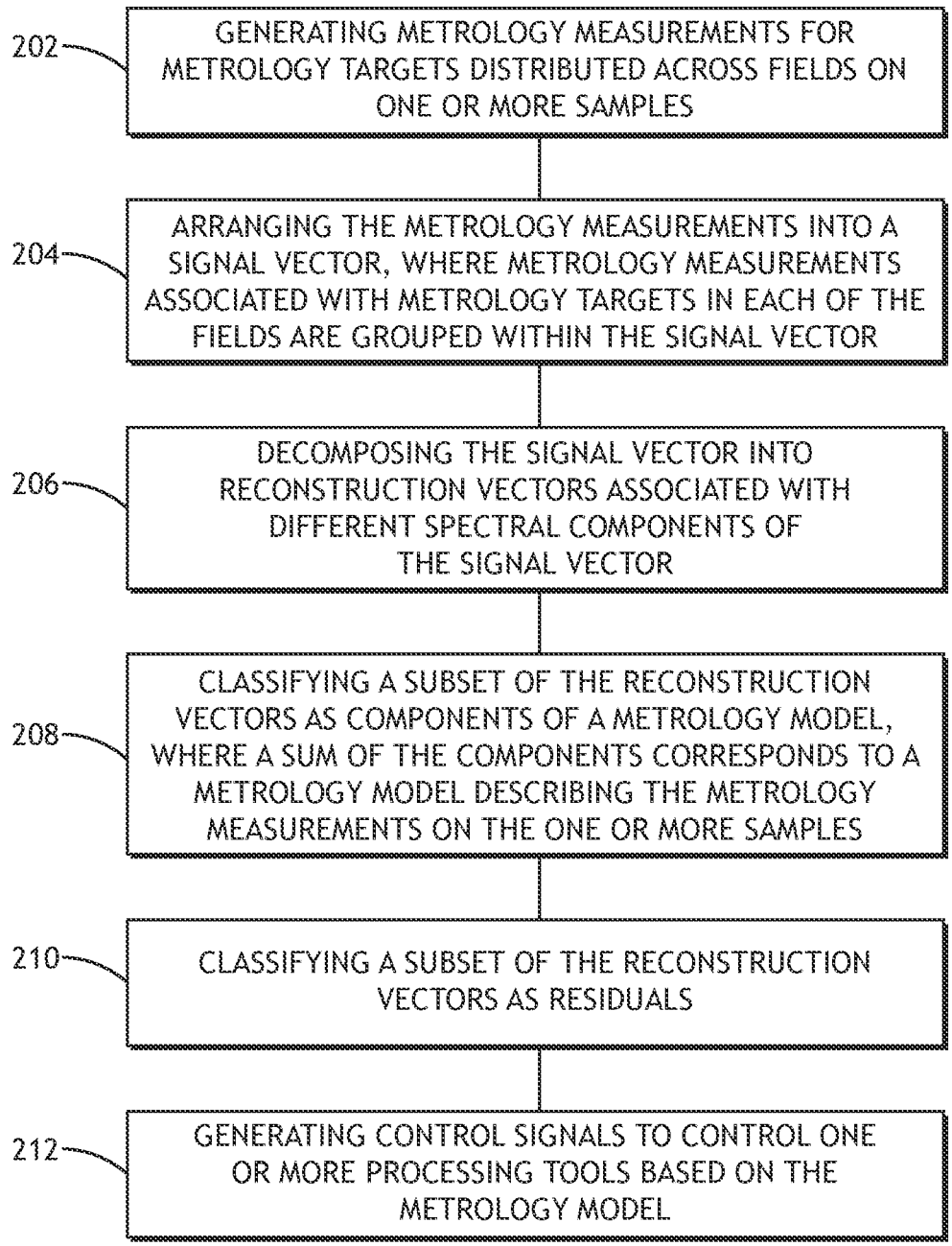
FIG. 2 is a flow diagram illustrating steps performed in a method, in accordance with one or more embodiments of the present disclosure.

FIG. 2 is a flow diagram illustrating steps performed in a method 200, in accordance with one or more embodiments of the present disclosure. Applicant notes that the embodiments and enabling technologies described previously herein in the context of the metrology system 100 should be interpreted to extend to the method 200. It is further noted, however, that the method 200 is not limited to the architecture of the metrology system 100.

In embodiments, the method 200 includes a step 202 of generating metrology measurements for metrology targets 104 distributed across fields 306 on one or more samples 106 (e.g., in accordance with a metrology recipe).

Figure 3:
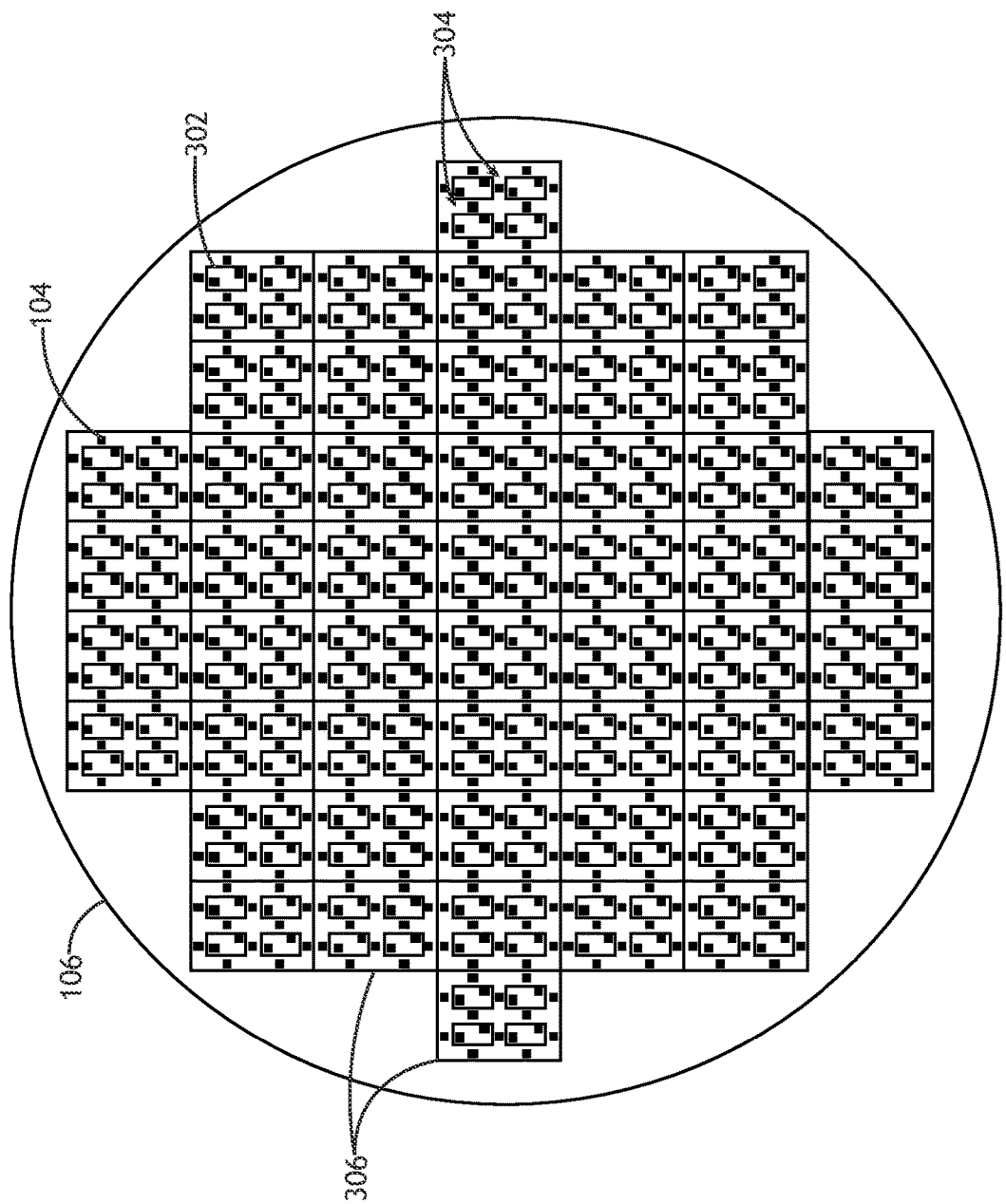
FIG. 3 is a conceptual top view of a sample depicting a distribution of metrology targets, in accordance with one or more embodiments of the present disclosure.

FIG. 3 is a conceptual top view of a sample 106 depicting a distribution of metrology targets 104, in accordance with one or more embodiments of the present disclosure.

As shown in FIG. 3, varies dies 302 including fabricated features may be distributed across a sample 106, where the dies 302 are separated by scribe lines 304. Further, the various dies 302 across the sample 106 may be identical. Additionally, the dies 302 may be associated with different fields 306 (e.g., exposure fields) associated with a lithography tool (e.g., a scanner, a stepper, or the like). For example, features on the dies 302 may be fabricated by sequential processing steps including, but not limited to, deposition of a sample layer (e.g., a dielectric layer, a conducting layer, or the like), deposition of a photoresist, lithographic exposure of a pattern into the photoresist (e.g., through sequential exposure of the various fields 306), and etching of the photoresist and the sample layer.

FIG. 3 further depicts various metrology targets 104 distributed within each of the fields 306. The metrology targets 104 may generally be located in any suitable locations in a field 306 such as in the scribe lines 304 and/or in any of the dies 302. In embodiments, each field 306 has a common number and distribution of metrology targets 104.

The metrology measurements measured in step 202 may include any type of data including, but not limited to, overlay measurements, illumination dose measurements, or focal position measurements of the sample 106 during a lithographic exposure step. Further, the metrology measurements may be generated using any technique known in the art. For example, the metrology measurements may be, but are not required to be, generated using the metrology subsystem 102.

The metrology measurements of the metrology targets 104 distributed across one or more samples 106 may be captured in any order (e.g., using any sampling plan). In some embodiments, metrology measurements for metrology targets 104 in one field 306 are captured before metrology targets 104 in another field 306. In some embodiments, measurements for metrology targets 104 across the sample 106 are captured without regard to the field 306. For example, the sampling plan may be selected to provide efficient generation of measurements for the metrology targets 104 across the sample 106. Further, metrology measurements of the metrology targets 104 may be captured serially or through parallel measurements of two or more metrology targets 104.

It is noted that FIG. 3 and the associated description is provided solely for illustrative purposes and should not be interpreted as limiting. For example, FIG. 3 is not drawn to scale and the number, type, size, and/or arrangement of features (e.g., dies 302, metrology targets 104, fields 306, and the like) are merely illustrative.

In embodiments, the method 200 includes a step 204 of arranging the metrology measurements into a signal vector, where metrology measurements associated with metrology targets 104 in each of the fields 306 are grouped within the signal vector. The signal vector may generally have any number of dimensions (e.g., one dimension, two dimensions, or the like). Further, an order of the metrology measurements associated with the metrology targets 104 in each field 306 within the signal vector may be constant. In this way, any systematic variations between the metrology measurements of the metrology targets 104 within each field 306 may result in periodicity of the signal vector. As will be shown below with respect to step 208, these systematic variations between the metrology measurements of the metrology targets 104 within each field 306 may correspond to a field model of the process.

As an illustration of a one-dimensional signal vector, the signal vector S may be written as:

$$S=[S_1,\ldots,S_{n\times N}]=[S_1,\ldots,S_N]=[\text{MET}_{T_1}^{F_1},\\ \text{MET}_{T_2}^{F_1},\ldots,\text{MET}_{T_n}^{F_1},\text{MET}_{T_1}^{F_2},\\ \text{MET}_{T_2}^{F_2},\ldots,\text{MET}_{T_n}^{F_2},\ldots,\text{MET}_{T_1}^{F_N},\\ \text{MET}_{T_2}^{F_N},\ldots,\text{MET}_{T_n}^{F_N}] \quad (1)$$

where MET corresponds to a particular one of the metrology measurements, N is a number of the fields 306, the superscripts $F_1 \ldots F_N$ corresponds to the fields 306, n=$\mathcal{M}$ is the number of the metrology targets 104 in each field 306, and the subscripts $T_1 \ldots T_n$ correspond to the metrology targets 104 within each field 306. In this way, $\text{MET}_{T_1}^{F_1}$ corresponds to a metrology measurement of a first metrology target 104 in a first field 306, $\text{MET}_{T_2}^{F_1}$ corresponds to a metrology measurement of a second metrology target 104 in the first field 306, $\text{MET}_{T_1}^{F_2}$ corresponds to a metrology measurement of a first metrology target 104 in a second field 306, and so on. Further, $\mathcal{N}$ =n×N is a number of metrology measurements in the signal vector S.

The metrology measurements associated with the metrology targets 104 in each field 306 may generally have any order (e.g., $T_1 \ldots T_n$ may correspond to any order of particular metrology targets 104 in a field 306) as long as this order is constant for all fields 306 in the signal vector. However, in some embodiments, the order is based on the physical layout of the metrology targets 104 within the field. For example, the order $T_1 \ldots T_n$ may be selected such that the associated metrology targets 104 are physically proximate (e.g., neighbors, nearest neighbors, or the like). It is contemplated herein that arranging an order of the metrology measurements within each field 306 of the signal vector based on the physical layout of the metrology targets 104 may promote physically meaningful relationships between the data points in the signal vector. For instance, systematic variations of the metrology measurements within each field (e.g., patterns captured by a field model) may be related to spatial variations in a fabrication process across the sample, which may be readily captured through such an ordering.

In some embodiments, the signal vector may include metrology measurements from two or more samples 106. In this case, the metrology measurements in the signal vector may be further grouped by sample 106. For example, the pattern in Equation (1) may be repeated for each sample 106. As described in greater detail below, such a configuration may enable modeling of sample-sample variations in the metrology measurements.

In embodiments, the method 200 includes a step 206 of decomposing the signal vector into reconstruction vectors associated with different spectral components of the signal vector. Any suitable spectral decomposition technique may be utilized such as, but not limited to, SVD, principal component analysis techniques, or any eigenvalue-based decomposition technique. In some embodiments, the reconstruction vectors describe different spectral components of the signal vector (e.g., different length scales of the signal vector). In this way, the signal vector S may be expressed as a sum of the reconstruction vectors. For example, the signal vector S may be expressed as a sum of $\mathcal{M}$ reconstruction vectors R:

$$S = \sum_{k=1}^{\mathcal{M}} R_k \qquad (2)$$

It is contemplated herein that the reconstruction vectors generated using spectral decomposition techniques as disclosed herein may be based on analysis of the metrology data itself (e.g., using eigenvalue-based techniques, or the like). Techniques disclosed herein may thus provide a universal model (e.g., a universal metrology model) suitable for a wide variety of applications and datasets. As a result, techniques disclosed herein may outperform regression-based techniques such as, but not limited to, polynomial regression techniques in which polynomials are used as basis vectors for expressing the metrology data. In particular, the accuracy of regression-based techniques may be limited to by the ability of the selected basis to accurately represent the variations in the metrology data.

In embodiments, the method 200 includes a step 208 of classifying a subset of the reconstruction vectors as components of a metrology model, where a sum of the components corresponds to a metrology model describing the metrology measurements on the one or more samples.

The step 208 may generally include classifying the reconstruction vectors into any number of subsets that may correspond to different aspects of the metrology model.

In embodiments, the step 208 includes classifying a subset of the reconstruction vectors as wafer components, where a sum of the reconstruction vectors classified as wafer components corresponds to a wafer model describing variations of the metrology measurements between the fields 306. Such patterns may be characterized as low-frequency (LF) patterns or large length scales for which variations between metrology measurements between adjacent metrology targets 104 (e.g., $T_j$ to $T_{j+1}$) may be insignificant.

In embodiments, step 208 includes classifying a subset of the reconstruction vectors as field components, where a sum of the reconstruction vectors classified as field components corresponds to a field model describing variations of the metrology measurements between the metrology targets 104 within each field 306. For example, the field model may describe variations of the signal vector S with periodicities on the order of the magnitude of the number (n) of metrology targets 104 sampled in each field 306. Such patterns may be characterized as mid-frequency (MF) patterns or medium length scales for which the metrology measurement may vary between the various metrology targets 104 in a field 306, but a pattern associated with the metrology may be consistent between fields 306.

More generally, the method 200 may include classifying the reconstruction vectors into any number groups (e.g., classification) having meaningful distinctions. In the case of multi-sample measurements, a subset of the reconstruction vectors may be classified as inter-sample components, which may correspond to drifts of the process over multiple samples 106.

For example, metrology model may include both the field model and the wafer model, which may describe variations of the metrology measurements at different length scales (e.g., intra-field length scales, inter-field length scales, sample-wide length scales, or the like). Further, no a priori information or assumptions are required for the identification of the field and/or wafer models and associated components.

In embodiments, the method 200 includes a step 210 of classifying a subset of the reconstruction vectors as residuals. For example, a remainder of the reconstruction vectors not classified as part of the metrology model (e.g., in step 208) may be considered residuals. Such patterns may be characterized as high-frequency (HF) patterns or small length scales that may not fit into the above categories.

The resulting classified reconstruction vectors and/or the associated models (e.g., portions of the metrology model) may be used for any suitable purpose.

In embodiments, the method 200 includes a step 212 of generating control signals to control one or more processing tools based on the metrology model. For example, the field model (and/or the wafer model) may be used as control data for the control of any type of processing tool such as, but not limited to, a lithography tool (e.g., a scanner, a stepper, or the like). In this way, the step 212 may include generating correctables for one or more processing tools to compensate for any undesirable deviations of the metrology measurements. Further, the correctables may be associated with feedback control related to the formation of similar structures on subsequent samples 106 and/or feed-forward control related to the formation of additional structures on additional layers of the same samples 106 (e.g., the one or more samples associated with the signal vector).

Referring now to Equations (3)-(4), decomposition of the signal vector into reconstruction vectors is described in greater detail, in accordance with one or more embodiments of the present disclosure. In particular, Equations (3)-(4) illustrate a non-limiting example of a singular spectrum analysis (SSA) technique utilizing SVD. As shown herein, such a technique may facilitate the decomposition of the signal vector into both field components and wafer components (e.g., low-frequency, mid-frequency, and high-frequency patterns relative to the number (n) of metrology targets 104 per field 306 more generally).

In some embodiments, the signal vector is mapped to a matrix O with an embedding dimension $\mathcal{M}$. For example, O may be written as:

$$O = \begin{pmatrix} S_1 & S_2 & S_3 & \dots & S_M \\ S_2 & S_3 & S_4 & \dots & S_{M+1} \\ \vdots & \vdots & \vdots & \ddots & \vdots \\ S_{N-M+1} & S_{N-M+2} & S_{N-M+3} & \dots & S_N \end{pmatrix}_{(N-M+1) \times M} \quad (3)$$

For example, each row (or column) of the matrix O may include a series of lagged vectors associated with a subset of the signal vector S. Such a matrix may be characterized as a transfer matrix or a Hankel matrix and may have the property that elements $O_{ij}$ on diagonals i+j=C are equal.

The embedding dimension $\mathcal{M}$ may generally have any value between 1 and the length of the signal vector $\mathcal{N}$ (1< $\mathcal{M}$ < $\mathcal{N}$). In some embodiments, the embedding dimension $\mathcal{M}$ is selected to be equal to the number of metrology targets 104 measured in each field 306 ($\mathcal{M}$ =n). This selection may facilitate decomposition of the signal vector in a way that characterizes well the field components such that an accurate field model may be constructed. However, it is contemplated that any suitable value of the embedding dimension $\mathcal{M}$ may be used.

In some embodiments, SVD is performed on the matrix O such that O may be written as:

$$O = U\Sigma V^T = \Sigma_{k=1}^{\mathcal{M}} \sigma_k U_k V_k^T = \Sigma_{k=1}^{\mathcal{M}} O_k \quad (4)$$

In this formulation, the matrix $\Sigma$ is a diagonal matrix containing the singular values $\sigma_1 \dots \sigma_k$ of O (in decreasing order from largest to smallest), where $\sigma_1^2 \dots \sigma_k^2 = \lambda_1 \dots \lambda_k$ are eigenvalues of the covariance matrix $C = O^T O$. Further, the eigenvectors of $C = O^T O$ make up the columns of the matrix V, while the eigenvectors of $OO^T$ make up the columns of the matrix U.

Reconstruction vectors $R_k$ (see Equation (2) above), each having the same length ($\mathcal{N}$ =n×N) as the signal vector S, may then be generated by a diagonal operation (e.g., a diagonal mean, or the like) of the matrices $O_k$.

Referring now to FIGS. 4-7, an example spectral decomposition based on the non-limiting technique illustrated by equations (1)-(4) is described. In this example, a sample 106 included 27 fields 306 (N=27) where each included 10 metrology targets 104 (n=10). Further, the particular metrology measurements in this example are overlay (OVL) measurements.

Figure 4:
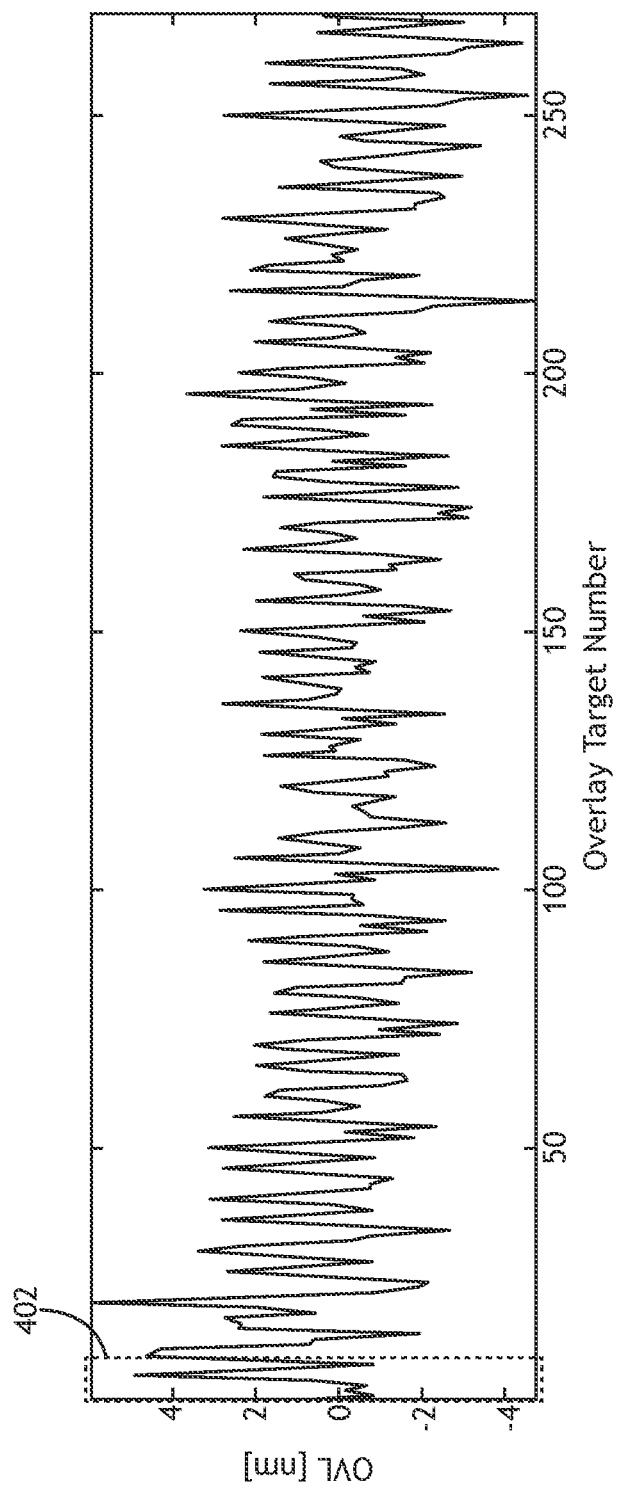
FIG. 4 is a plot of a signal vector, in accordance with one or more embodiments of the present disclosure.

FIG. 4 is a plot of the signal vector S as formulated by Equation (1), in accordance with one or more embodiments of the present disclosure. In particular, FIG. 4 depicts the value of the metrology measurement OVL per site (e.g., metrology target 104) arranged according to Equation (1). The box 402 in FIG. 4 depicts a first field 306 (e.g., $F_1$).

Figure 5:
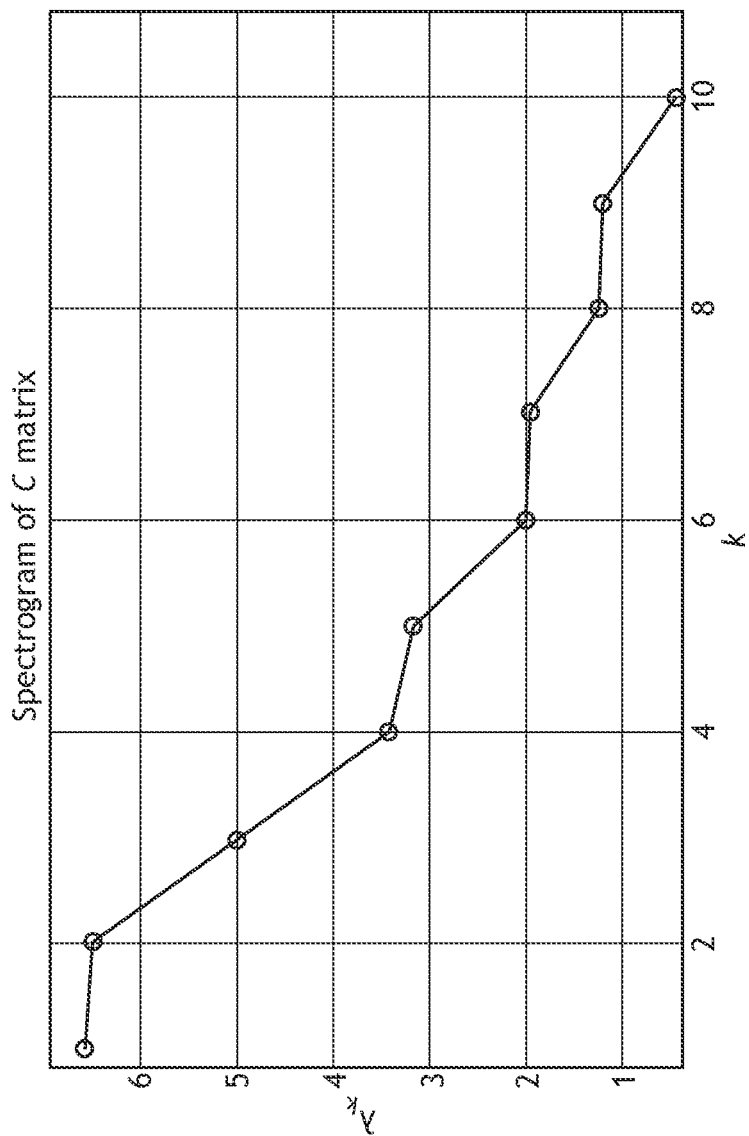
FIG. 5 is a plot of eigenvalues of a covariance matrix, in accordance with one or more embodiments of the present disclosure.

FIG. 5 is a plot of the eigenvalues $\lambda_1 \dots \lambda_k$ of the covariance matric $C = O^T O$ based on Equations (3)-(4) with an embedding dimension $\mathcal{M}$ =n=10, in accordance with one or more embodiments of the present disclosure. In this way, FIG. 5 corresponds to a plot of the spectrogram of the covariance matrix C.

Figure 6:
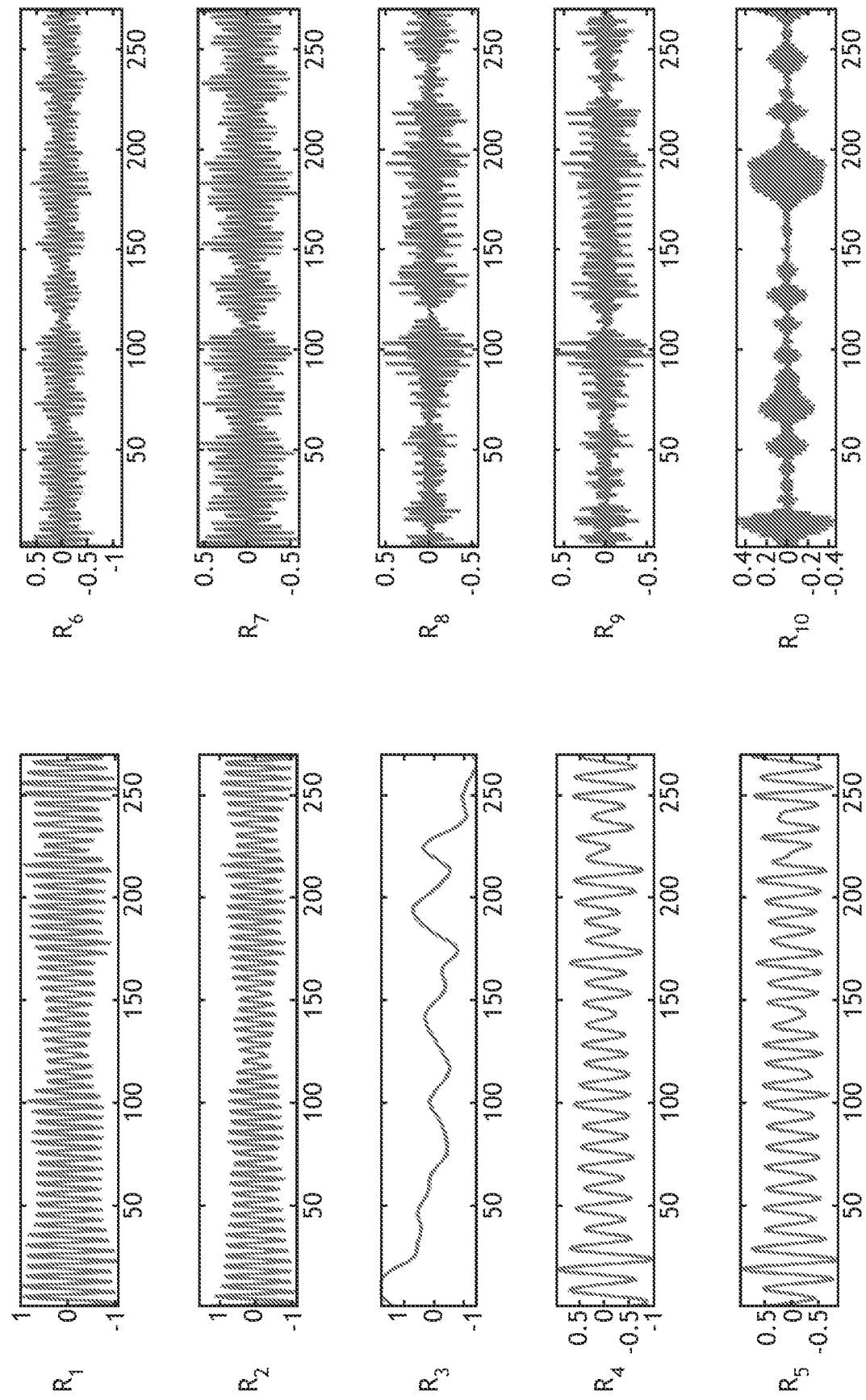
FIG. 6 is a series of plots depicting reconstruction vectors, in accordance with one or more embodiments of the present disclosure.

FIG. 6 is a series of plots depicting the reconstruction vectors $R_k$ for k=1 . . . 10 generated by diagonal means of the matrices $O_k$, in accordance with one or more embodiments of the present disclosure.

As illustrated in FIG. 6, different reconstruction vectors $R_k$ include different frequency components (e.g., spectral components, length scale information, or the like) associated with the signal vector S. It is noted that, per Equation (4) and FIG. 5, the relative contribution of the reconstruction vectors $R_k$ decreases as k increases.

Referring back to FIG. 2 (e.g., steps 208 and 210), the reconstruction vectors $R_k$ may be classified into different groups to quantify different behaviors of the metrology measurements across the sample 106.

For example, $R_3$ may be classified as a wafer component (and thus a wafer model). As another example, $R_1$, $R_2$, $R_4$, and $R_5$ may be classified as field components such that the sum of these components may correspond to a field model. As another example, the reconstruction vectors $R_k$ for k=6 . . . 10 may be classified as residual components such that the sum of these components may be residuals of a model.

Figure 7:
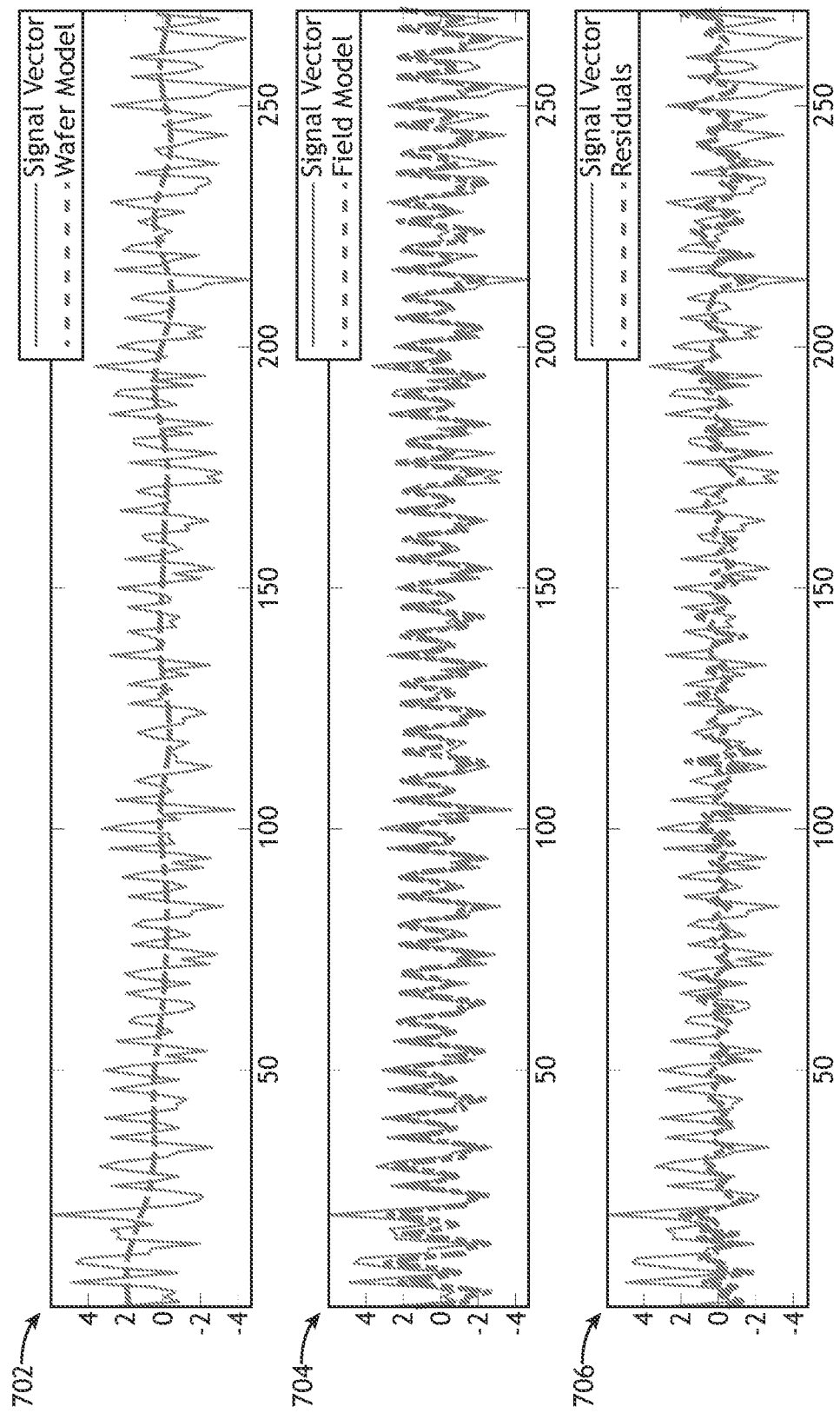
FIG. 7 is a series of plots depicting a wafer model, field model, and residuals compared to the raw signal vector based on FIG. 6, in accordance with one or more embodiments of the present disclosure.

FIG. 7 is a series of plots 702,704,706 depicting the wafer model, field model, and residuals, respectively, compared to the raw signal vector based on these classifications, in accordance with one or more embodiments of the present disclosure. As shown in plot 704, the field model captures well the periodic systematic variations of the metrology data within each field, the wafer model captures relatively large length scale variations (e.g., inter-field variations), and the residuals capture the measurement noise. Further, such analysis is possible without any a priori knowledge or assumptions about the field model and further without imposing any particular polynomial basis for regression. Rather, the classification is based on the eigenvalue-based decomposition of the metrology data itself after being arranged in a meaningful way into the signal vector as depicted in Equation (1) (e.g., step 204). In this way, the techniques disclosed herein may provide a universal model for characterizing metrology measurements.

It is noted that the definition of a residual for the techniques disclosed herein is different than for regression-based approaches. In this case, the residuals are associated only with pure noise related to insignificant eigenvalues, the mean of residuals is not guaranteed to be definitely zero.

As described previously herein, the value of the embedding length $\mathcal{M}$ may be any suitable value. However, in at least some cases as illustrated by FIGS. 4-7, setting the embedding length $\mathcal{M}$ to be equal to the number of metrology targets 104 per field 306 may provide accurate and universal determination of the field model (e.g., a field signature).

Further, it is contemplated herein that the reconstruction vectors may be classified (e.g., based on step 208 and/or step 210) using any suitable technique. In some embodiments, the reconstruction vectors are classified based on a relationship between length scales captured by the reconstruction vectors and the length scales within an operational range (e.g., scanning range) and/or resolution of a processing tool (e.g., a lithography tool, or the like). For example, a lithography tool may control the placement of a field 306 on a sample 106 within a certain operational range and within a certain resolution. Accordingly, reconstruction vectors may be classified as field components if they contain length scales with the operational range and/or resolution. As an illustration, reconstruction vectors including length scales smaller than the resolution of the lithography tool (e.g., high-frequency signals) may be deemed residuals since any control signals required to correct for such signals may be beyond the capabilities of the lithography tool. In some embodiments, the reconstruction vectors may be classified at least in part through user input. For example, the reconstruction vectors may be displayed to the user via the user interface 114 (e.g., in the form of plots similar to those depicted in FIG. 6) for evaluation and input.

Referring now generally to FIGS. 5-7, it is contemplated herein that it may be possible to describe the spectral components of the signal vector S in a more efficient form than provided by the reconstruction vectors directly. As an illustration, FIG. 5 indicates several pairs of degenerate or nearly degenerate eigenvalues $\lambda_k$ (e.g., k=1 and k=2, k=4 and k=5, k=6 and k=7, k=8 and k=9). This is also evidenced in FIG. 6 in that reconstruction vectors in each of these pairs contain similar frequencies and have non-uniform envelopes indicating additional structure.

In some embodiments, the method 200 includes applying a rotation of the set of reconstruction vectors (or a portion thereof), which may provide a more efficient description of the spectral components of the signal vector S. Any suitable rotation technique may be utilized such as, but not limited to, varimax rotation, quartimax rotation, or equimax rotation. Such a step may be, but is not required to be, implemented prior to or as part of the classification of reconstruction vectors as field components, wafer components, residuals or the like (e.g., as depicted in steps 208 and/or step 210 of FIG. 2).

Referring now to FIG. 2 generally, it is contemplated herein that spectral decomposition techniques for metrology modeling as disclosed herein may inform the metrology sampling plan (e.g., step 202). As depicted in Equation (4) and FIG. 5, the matrix $C=O^TO$ (e.g., the covariance matrix) has a rank $r<\mathcal{M}$. In many applications, however, the matrix C is fairly redundant and has eigenvalues that may rapidly diminish for $k<\mathcal{M}$. It may thus be possible to exploit the redundancy of the covariance matrix C to reconstruct it by proper selection or adjustments of the sampling plan (e.g., the specific choices of metrology targets 104 to and/or the number of metrology targets 104 sampled when generating the signal vector S. For example, the number of metrology targets 104 sampled (n=$\mathcal{M}$) may be selected or adjusted (e.g., reduced) to efficiently capture the field and/or wafer model.

A sampling plan describing which metrology targets 104 are sampled to generate metrology data (e.g., by the metrology sub-system 102) may be reduced by skipping metrology measurements (e.g., in step 202) for a random selection of metrology targets 104. A matrix reconstruction technique (e.g., a gap filling technique, or the like) may then be used to populate values these skipped metrology measurements. Put another way, a full sampling plan may include all of the metrology targets 104 associated with the signal vector S (e.g., a repeating pattern of metrology targets 104 in each field 306) such that all of the metrology measurements associated with step 202 are generated based on metrology data generated by sampling the corresponding metrology targets (e.g., by the metrology sub-system 102). However, in some embodiments, the sampling plan includes only a portion of the metrology targets 104 associated with the signal vector S. In this configuration, a first portion of the measurements are generated based on metrology data generated by sampling the corresponding metrology targets 104, while a second portion of the metrology measurements are generated by matrix reconstruction based on the first portion of the metrology measurements.

It is contemplated herein that the specific number of skipped metrology measurements may be tailored for a given application based on a variety of factors including, but not limited to, a sparsity of the matrix $C=O^TO$ for a given application, a tolerance for artifacts or inaccuracies introduced by replacing skipped measurements with reconstructed values, or the like.

As an illustration, spectral decomposition of metrology measurements based on a first sampling plan may be performed (e.g., based on the method 200 or any subset of steps therein). If an analysis of the covariance matrix C reveals that one or more eigenvalues $\lambda_k$ are zero or have a negligible value (e.g., below a selected threshold), this may be an indication of oversampling. Accordingly, the sampling plan may be selected and/or adjusted to decrease a number of zero or negligible eigenvalues $\lambda_k$. Put another way, the sampling plan may be selected and/or adjusted to provide a selected number of the eigenvalues $\lambda_k$ with values above a selected threshold. This selection and/or any adjustments may be made prior to a high-volume manufacturing (HVM) phase (e.g., in a testing or evaluation phase) or during a HVM phase (e.g., where adjustments impact the sampling plan for future measurements).

Referring again to FIGS. 1A-1C, various aspects of the metrology system 100 are described in greater detail, in accordance with one or more embodiments of the present disclosure.

Figure 1B:
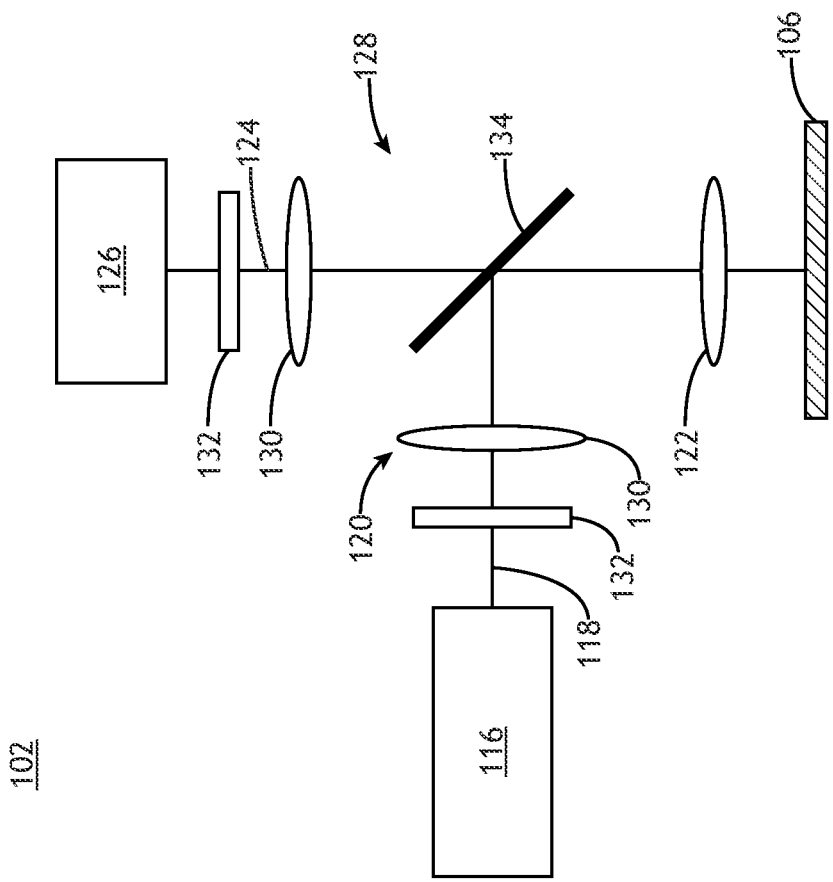
FIG. 1B is a conceptual diagram of an optical metrology sub-system, in accordance with one or more embodiments of the present disclosure.

In some embodiments, the metrology sub-system 102 is an optical sub-system that generates a metrology measurement by illuminating the metrology target 104 with light and collecting light from the metrology target 104 as the basis of the measurement. FIG. 1B is a conceptual diagram of an optical metrology sub-system 102, in accordance with one or more embodiments of the present disclosure.

An optical metrology sub-system 102 may generally include an illumination source 116 to generate an illumination beam 118 having any spectrum or temporal profile, an illumination pathway 120 to direct the illumination beam 118 to a metrology target 104, an objective lens 122 or other suitable component to collect light from the metrology target 104 (referred to herein as sample light 124), a detector 126, and a collection pathway 128 to direct the sample light 124 to the detector 126. The illumination pathway 120 and/or the collection pathway 128 may include any number or type of lenses 130 or other optical elements 132 suitable for manipulating the illumination beam 118 and/or the sample light 124 such as, but not limited to, one or more polarizers, one or more beamsplitters 134, one or more homogenizers, or one or more apodizers.

An optical metrology sub-system 102 may generate a metrology measurement using any suitable technique. In some embodiments, an optical metrology sub-system 102 generates a metrology measurement based on an image of the metrology target 104 (e.g., a field-plane image in which the detector 126 is in a field plane conjugate to the sample 106). In some embodiments, an optical metrology sub-system 102 generates a metrology measurement using a scatterometry technique based on collected diffraction orders (e.g., as measured by a detector 126 in a pupil plane). Further, the sample 106 may either be static or in motion during a measurement.

In some embodiments, the metrology sub-system 102 is a particle-beam sub-system that generates a metrology measurement by illuminating the metrology target 104 with a particle beam (e.g., an electron beam, an ion beam, a neutral particle beam, or the like) and collecting any combination of particles or light from the metrology target 104 as the basis of the measurement. FIG. 1C is a conceptual diagram of a particle-beam metrology sub-system 102, in accordance with one or more embodiments of the present disclosure.

A particle-beam metrology sub-system 102 may include a particle source 136 (e.g., an electron beam source, an ion beam source, or the like) such that an illumination beam 118 includes a particle beam (e.g., an electron beam, a particle beam, or the like). The illumination source 116 may include any particle source known in the art suitable for generating an illumination beam 118. For example, the illumination source 116 may include, but is not limited to, an electron gun or an ion gun. A particle-beam metrology sub-system 102 may further include an illumination pathway 120 with one or more particle beam lenses 138 (e.g., electrostatic, magnetic, uni-potential, double-potential lenses, or the like) or other beam manipulation elements (not shown) to control one or more aspects of the illumination beam 118 such as, but not limited to, one or more stigmators or aberration-control elements. A particle-beam metrology sub-system 102 may further include a collection pathway 128 to direct any combination of particles or light to at least one detector 126. For example, the detector 126 may include includes an electron collector (e.g., a secondary electron collector, a backscattered electron detector, or the like). As another example, the detector 126 may include includes a photon detector (e.g., a photodetector, an x-ray detector, a scintillating element coupled to photomultiplier tube (PMT) detector, or the like) for detecting electrons and/or photons from the sample surface. As an illustration, FIG. 1C depicts a detector 126 arranged to capture secondary electrons emitted from the metrology target 104.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected" or "coupled" to each other to achieve the desired functionality, and any two components capable of being so associated can also be viewed as being "couplable" to each other to achieve the desired functionality. Specific examples of couplable include but are not limited to physically interactable and/or physically interacting components and/or wirelessly interactable and/or wirelessly interacting components and/or logically interactable and/or logically interacting components.

It is believed that the present disclosure and many of its attendant advantages will be understood by the foregoing description, and it will be apparent that various changes may be made in the form, construction, and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. A metrology system comprising:
a controller including one or more processors configured to execute program instructions stored in memory, the program instructions configured to cause the one or more processors to:
arrange metrology measurements for a plurality of metrology targets distributed in a plurality of fields on one or samples into a signal vector, wherein the metrology measurements associated with the metrology targets in each of the plurality of fields are grouped within the signal vector;
decompose the signal vector into reconstruction vectors associated with different spectral components of the signal vector by mapping the signal vector to a matrix with an embedding dimension, decomposing the matrix to generate multiple matrices, and generating the reconstruction vectors from the multiple matrices;
classify a subset of the reconstruction vectors as components of a metrology model, wherein a sum of the components corresponds to the metrology model describing the metrology measurements on the one or more samples; and
generate correctables for one or more processing tools based on the metrology model; and
provide the correctables to the one or more process tools to provide feedback or feedforward control to the one or more process tools.

2. The metrology system of claim 1, wherein the metrology model corresponds to a field model describing variations of the metrology measurements between the metrology targets within each of the plurality of fields.

3. The metrology system of claim 1, wherein the one or more processing tools include a lithography tool, wherein the lithography tool is controllable based on the control signals, wherein classifying a subset of the reconstruction vectors as components of the metrology model comprises:
classifying the subset of the reconstruction vectors having spectral components as the components of the metrology model.

4. The metrology system of claim 1, wherein the metrology model corresponds to a wafer model describing variations of the metrology measurements between the plurality of fields.

5. The metrology system of claim 1, wherein the reconstruction vectors not classified as components of the metrology model correspond to residuals.

6. The metrology system of claim 1, wherein the metrology model includes a field model and a wafer model, wherein classifying a subset of the reconstruction vectors as components of the metrology model comprises:
classifying a first subset of the reconstruction vectors as field components, wherein the field model corresponds to a sum of the field components; and
classifying a second subset of the reconstruction vectors as wafer components, wherein the wafer model corresponds to a sum of the wafer components.

7. The metrology system of claim 6, wherein the reconstruction vectors not classified as components of the field model or the wafer model correspond to residuals.

8. The metrology system of claim 6, wherein the control signals to control the one or more processing tools are based on at least one of the field model or the wafer model.

9. The metrology system of claim 1, wherein all of the metrology measurements are generated based on metrology data generated by sampling the corresponding metrology targets of the plurality of metrology targets.

10. The metrology system of claim 1, wherein a first portion of the metrology measurements are generated based on metrology data generated by sampling the corresponding metrology targets of the plurality of metrology targets, wherein a second portion of the metrology measurements are generated by matrix reconstruction based on the first portion of the metrology measurements.

11. The metrology system of claim 1, wherein an order of the metrology measurements associated with the metrology targets in each of the plurality of fields within the signal vector is constant.

12. The metrology system of claim 1, wherein the one or more samples includes two or more samples, wherein the metrology measurements associated with each of the two or more samples are grouped within the signal vector, wherein an order of the metrology measurements associated with the metrology targets in each of the two or more samples is constant.

13. The metrology system of claim 1, wherein decomposing the signal vector into the reconstruction vectors associated with different spectral components of the signal vector comprises:

performing a singular spectrum analysis of the signal vector to generate the reconstruction vectors.

14. The metrology system of claim 1, wherein the signal vector is one dimensional.

15. The metrology system of claim 1, wherein the signal vector is two dimensional.

16. The metrology system of claim 1, wherein the decomposing the signal vector into the reconstruction vectors associated with different spectral components of the signal vector comprises:

mapping the signal vector to a matrix O with an embedding dimension $\mathcal{M}$;

decomposing O to generate matrices $O_k$, where $O = \Sigma_{k=1,\mathcal{M}} O_k$; and generating the reconstruction vectors $R_k$ from the matrices $O_k$.

17. The metrology system of claim 16, wherein elements $O_{ij}$ on diagonals i+j=C are equal.

18. The metrology system of claim 16, wherein decomposing O to generate the matrices $O_k$ comprises:

performing a singular value decomposition of O to generate the matrices $O_k$.

19. The metrology system of claim 16, wherein decomposing O to generate the matrices $O_k$ comprises:

performing a principal component analysis of O to generate the matrices $O_k$.

20. The metrology system of claim 16, wherein the reconstruction vectors $R_k$ are associated with k eigenvalues of $C = O^T O$, wherein arranging the metrology measurements for the plurality of metrology targets distributed in the plurality of fields on the one or samples into the signal vector comprises:

arranging the metrology measurements from a sampling plan into the signal vector, wherein the sampling plan is selected to provide a selected number of the eigenvalues $\lambda_k$ with values above a selected threshold.

21. The metrology system of claim 16, wherein the embedding dimension $\mathcal{M}$ is equal to a number of metrology targets in each of the plurality of fields.

22. The metrology system of claim 21, wherein the signal vector is formed as:

$$S = [S_1, \ldots, S_{n \times N}] = [S_1, \ldots, S_N] = [\text{MET}_{T_1}^{F1},\\ \text{MET}_{T_2}^{F1}, \ldots, \text{MET}_{T_n}^{F1}, \text{MET}_{T_1}^{F2},\\ \text{MET}_{T_2}^{F2}, \ldots, \text{MET}_{T_n}^{F2}, \ldots, \text{MET}_{T_1}^{FN},\\ \text{MET}_{T_2}^{FN}, \ldots, \text{MET}_{T_n}^{FN}],$$

where MET corresponds to a particular one of the metrology measurements, N is a number of the plurality of fields, superscripts $F_1 \ldots F_N$ correspond to the plurality of fields, $n = \mathcal{M}$ is the number of the metrology targets in each of the plurality of fields, and the subscripts $T_1 \ldots T_n$ correspond to the metrology targets within each of the plurality of fields.

23. The metrology system of claim 22, wherein $$O = \begin{pmatrix} S_1 & S_2 & S_3 & \ldots & S_M \\ S_2 & S_3 & S_4 & \ldots & S_{M+1} \\ \vdots & \vdots & \vdots & \ddots & \vdots \\ S_{N-M+1} & S_{N-M+2} & S_{N-M+3} & \ldots & S_N \end{pmatrix}_{(N-M+1) \times M}$$

where $\mathcal{N} = n \times N$.

24. The metrology system of claim 16, wherein generating the reconstruction vectors $R_k$ from the matrices $O_k$ comprises:

generating the reconstruction vectors $R_k$ from diagonal means of the matrices $O_k$.

25. The metrology system of claim 1, wherein the metrology measurements comprise:

overlay metrology measurements, wherein the plurality of metrology targets include overlay metrology targets.

26. The metrology system of claim 1, wherein all of the metrology measurements are generated based on metrology data generated by sampling the corresponding metrology targets of the plurality of metrology targets with the metrology sub-system.

27. The metrology system of claim 1, wherein a first portion of the metrology measurements are generated based on metrology data generated by sampling the corresponding metrology targets of the plurality of metrology targets with the metrology sub-system, wherein a second portion of the metrology measurements are generated by matrix reconstruction based on the first portion of the metrology measurements.

28. A metrology system comprising:

a metrology sub-system including an illumination source and a detector, wherein the metrology sub-system is configured to generate metrology measurements for a plurality of metrology targets distributed in a plurality of fields on one or more samples in accordance with a metrology recipe;

a controller including one or more processors configured to execute program instructions stored in memory, the program instructions configured to cause the one or more processors to:

arrange the metrology measurements into a signal vector, wherein the metrology measurements associated with the metrology targets in each of the plurality of fields are grouped within the signal vector;

decompose the signal vector into reconstruction vectors associated with different spectral components of the signal vector by mapping the signal vector to a matrix with an embedding dimension, decomposing the matrix to generate multiple matrices, and generating the reconstruction vectors from the multiple matrices;

classify a subset of the reconstruction vectors as components of a metrology model, wherein a sum of the components corresponds to the metrology model describing the metrology measurements on the one or more samples; and generate correctables for one or more processing tools based on the metrology model; and provide the correctables to the one or more process tools to provide feedback or feedforward control to the one or more process tools.

29. The metrology system of claim 28, wherein the metrology sub-system includes an optical metrology sub-system.

30. The metrology system of claim 28, wherein the metrology sub-system includes a particle-beam metrology sub-system.

31. The metrology system of claim 28, wherein the metrology model corresponds to a field model describing variations of the metrology measurements between the metrology targets within each of the plurality of fields.

32. The metrology system of claim 28, wherein the metrology model corresponds to a wafer model describing variations of the metrology measurements between the plurality of fields.

33. The metrology system of claim 28, wherein the reconstruction vectors not classified as components of the metrology model correspond to residuals.

34. The metrology system of claim 28, wherein the metrology model includes a field model and a wafer model, wherein classifying a subset of the reconstruction vectors as components of the metrology model comprises:
   classifying a first subset of the reconstruction vectors as field components, wherein the field model corresponds to a sum of the field components; and
   classifying a second subset of the reconstruction vectors as wafer components, wherein the wafer model corresponds to a sum of the wafer components.

35. A metrology method comprising:
   generating metrology measurements for a plurality of metrology targets distributed in a plurality of fields on one or more samples;
   arranging the metrology measurements into a signal vector, wherein the metrology measurements associated with the metrology targets in each of the plurality of fields are grouped within the signal vector;
   decomposing the signal vector into reconstruction vectors associated with different spectral components of the signal vector by mapping the signal vector to a matrix with an embedding dimension, decomposing the matrix to generate multiple matrices, and generating the reconstruction vectors from the multiple matrices;
   classifying a subset of the reconstruction vectors as components of a metrology model, wherein a sum of the components corresponds to the metrology model describing the metrology measurements on the one or more samples; and
   generating correctables for one or more processing tools based on the metrology model; and
   providing the correctables to the one or more process tools to provide feedback or feedforward control to the one or more process tools.

36. The metrology model of claim 35, wherein the metrology model corresponds to a field model describing variations of the metrology measurements between the metrology targets within each of the plurality of fields.

37. The metrology model of claim 35, wherein the metrology model corresponds to a wafer model describing variations of the metrology measurements between the plurality of fields.

38. The metrology model of claim 35, wherein the reconstruction vectors not classified as components of the metrology model correspond to residuals.

* * * * *